(12) United States Patent
Abughazaleh et al.

(10) Patent No.: US 10,998,911 B1
(45) Date of Patent: May 4, 2021

(54) FRACTIONAL N PLL WITH SIGMA-DELTA NOISE CANCELLATION

(71) Applicant: NXP USA, Inc., Austin, TX (US)

(72) Inventors: Firas N. Abughazaleh, Austin, TX (US); David Bearden, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/730,413

(22) Filed: Dec. 30, 2019

(51) Int. Cl.
*H03L 7/197* (2006.01)
*H03L 7/099* (2006.01)
*H03L 7/089* (2006.01)

(52) U.S. Cl.
CPC .......... *H03L 7/1976* (2013.01); *H03L 7/0891* (2013.01); *H03L 7/099* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 5,963,074 A | 10/1999 | Arkin | |
| 6,005,425 A * | 12/1999 | Cho ........................ | H03L 7/093 327/156 |
| 6,327,319 B1 * | 12/2001 | Hietala ................. | H03L 7/0891 327/156 |
| 7,764,094 B1 * | 7/2010 | Arora .................... | H03L 7/1976 327/157 |
| 8,193,845 B2 | 6/2012 | Jian et al. | |
| 9,236,873 B1 * | 1/2016 | Buell ...................... | H03L 7/093 |
| 9,490,818 B2 | 11/2016 | Perrott | |
| 9,634,678 B1 * | 4/2017 | Caffee .................. | H03L 7/0891 |
| 10,090,845 B1 | 10/2018 | Midha et al. | |
| 2004/0239386 A1 * | 12/2004 | Lim ....................... | H03L 7/1072 327/156 |
| 2006/0044031 A1 | 3/2006 | Cheung et al. | |
| 2009/0160565 A1 * | 6/2009 | Kawamoto ........... | H03L 7/1976 331/1 A |
| 2010/0327981 A1 * | 12/2010 | Yang ..................... | H03L 7/1976 331/17 |
| 2011/0234272 A1 * | 9/2011 | Yu ........................... | H03L 7/089 327/157 |
| 2013/0033293 A1 | 2/2013 | Zhang | |
| 2013/0257485 A1 * | 10/2013 | Nikaeen ................. | H03B 21/00 327/107 |
| 2015/0200676 A1 * | 7/2015 | Ainspan .................. | H03L 7/099 327/159 |

(Continued)

OTHER PUBLICATIONS

Galton, Ian, "Delta-Sigma Fractional-N Phase-Locked Loops"; Department of Electrical and Computer Engineering, University of California at San Diego, La Jolla, California; 2017; 11 pages.

(Continued)

*Primary Examiner* — Adam D Houston

(57) ABSTRACT

An apparatus is disclosed that includes a phase detector circuit for generating a first pulse signal based on first and second input clock signals. A first circuit adjusts the first pulse signal by delaying transmission of a leading edge of the first pulse signal, but not a trailing edge of the first pulse signal. A charge pump circuit charges or discharges a capacitor based on the adjusted first pulse signal, and a voltage controlled oscillator (VCO) circuit generates an output clock signal with a frequency that depends on a voltage on the capacitor.

20 Claims, 10 Drawing Sheets

(56) References Cited

U.S. PATENT DOCUMENTS

| | | | | |
|---|---|---|---|---|
| 2015/0372690 | A1* | 12/2015 | Tertinek | H03L 7/1976 327/156 |
| 2017/0288686 | A1* | 10/2017 | Gao | H03L 7/081 |
| 2018/0269886 | A1* | 9/2018 | Houdebine | H03K 5/00006 |
| 2019/0238144 | A1* | 8/2019 | Buell | H03L 7/093 |
| 2019/0260443 | A1* | 8/2019 | Sjoland | H04L 27/152 |
| 2019/0334529 | A1* | 10/2019 | Huang | H03L 7/181 |
| 2020/0076440 | A1* | 3/2020 | Ng | H03L 7/081 |
| 2020/0162084 | A1* | 5/2020 | Darabi | H03L 7/099 |

OTHER PUBLICATIONS

Hsu, Chun-Ming; "A Low-Noise Wide-BW 3.6-GHz Digital Fractional-N Frequency Synthesizer With a Noise-Shaping Time-to-Digital Converter and Quantization Noise Cancellation"; IEEE Journal of Solid-State Circuits; vol. 43, No. 12; Dec. 2008; pp. 2776-2786 (11 pages).

Pamarti, Sudhakar et al.; "Phase-Noise Cancellation Design Tradeoffs in Delta-Sigma Fractional-N PLLs"; IEEE Transactions on Circuits and Systems—II: Analog and Digital Signal Processing; vol. 50, No. 11; Nov. 2003; pp. 829-838 (10 pages).

Perrott, Michael H.; "Tutorial on Digital Phase-Locked Loops CICC 2009"; (A Thesis Submitted to the Faculty of the Graduate School of the University of Minnesota); Sep. 2009; 118 pages.

Soldner, Thomas M.; "Design of a Delta-Sigma Fractional-n PLL Frequency Synthesizer at 1.43 GHz"; Jul. 2012; 62 pages.

Wang, Lei et al.; "3-5 GHz 4-Channel UWB Beamforming Transmitter With 1° Scanning Resolution Through Calibrated Vernier Delay Line in 0.13-μm CMOS"; IEEE Journal of Solid-State Circuits; vol. 47, No. 12; Dec. 2012; pp. 3145-3159 (15 pages).

Zanuso, Marzo et al., "A Wideband 3.6 GHz Digital Fractional-N PLL with Phase Interpolation Divider and Digital Spur Cancellation"; IEEE Journal of Solid-State Circuits; vol. 46, No. 3; Mar. 2011; pp. 627-638 (12 pages).

\* cited by examiner

| PΦΔ | LUT 902 {  1st PWC | 2nd PWC | ΣD1 | ΣD2 | ΣD1+ΣD2 | D | ΣD1+ΣD2-D |
|---|---|---|---|---|---|---|---|
| 0 ps | 6 | 0 | 42 ps | 0 ps | 42 ps | 42 ps | 0 ps |
| 1 ps | 5 | 1 | 35 ps | 8 ps | 43 ps | 42 ps | 1 ps |
| 2 ps | 4 | 2 | 28 ps | 16 ps | 44 ps | 42 ps | 2 ps |
| 3 ps | 3 | 3 | 21 ps | 24 ps | 45 ps | 42 ps | 3 ps |
| 4 ps | 2 | 4 | 14 ps | 32 ps | 46 ps | 42 ps | 4 ps |
| 5 ps | 2 | 5 | 7 ps | 40 ps | 47 ps | 42 ps | 5 ps |
| 6 ps | 1 | 6 | 0 ps | 48 ps | 48 ps | 42 ps | 6 ps |
| 7 ps | 7 | 0 | 49 ps | 0 ps | 49 ps | 42 ps | 7 ps |
| 8 ps | 6 | 1 | 42 ps | 8 ps | 50 ps | 42 ps | 8 ps |
| 9 ps | 5 | 2 | 35 ps | 16 ps | 51 ps | 42 ps | 9 ps |
| 10 ps | 4 | 3 | 28 ps | 24 ps | 52 ps | 42 ps | 10 ps |
| 11 ps | 3 | 4 | 21 ps | 32 ps | 53 ps | 42 ps | 11 ps |
| 12 ps | 2 | 5 | 14 ps | 40 ps | 54 ps | 42 ps | 12 ps |
| 13 ps | 1 | 6 | 7 ps | 48 ps | 55 ps | 42 ps | 13 ps |
| 14 ps | 8 | 0 | 56 ps | 0 ps | 56 ps | 42 ps | 14 ps |
| 15 ps | 7 | 1 | 49 ps | 8 ps | 57 ps | 42 ps | 15 ps |
| 16 ps | 6 | 2 | 42 ps | 16 ps | 58 ps | 42 ps | 16 ps |
| 17 ps | 5 | 3 | 35 ps | 24 ps | 59 ps | 42 ps | 17 ps |
| 18 ps | 4 | 4 | 28 ps | 32 ps | 60 ps | 42 ps | 18 ps |
| ... | ... | ... | ... | ... | ... | ... | ... |

Fig. 9A

FRACTIONAL N PLL WITH SIGMA-DELTA NOISE CANCELLATION

BACKGROUND

Digital systems include a variety of circuits, many of which rely on clock signals (hereinafter "clocks") with different frequencies to synchronize the timing of operations, data transfers, etc. Phase-locked loops (PLLs) can supply these needed clocks.

PLLs need a reference clock. A crystal oscillator is often used to generate the reference clock at a base frequency. PLLs use the reference clock to generate clocks with frequencies that are multiples of the base frequency.

In general, a PLL contains a phase frequency detector (PFD), a low-pass loop filter, a voltage controlled oscillator (VCO) and a feedback path that includes a programmable frequency divider (hereinafter divider). The PFD receives two clock inputs; the reference clock, and a feedback clock from the divider. A clock has two edges; a leading edge that rises at the start of the clock period, and a trailing edge that typically marks the end of a half clock period. As will be described below the PFD detects a "phase error" (i.e., a time delay) between leading edges of the reference and feedback clocks. The VCO generates an output clock with a frequency $f_{out}$ that increases or decreases as the phase error increases or decreases.

The divider, also called a clock divider, is positioned in the feedback path between the VCO and the PFD. The divider receives and frequency divides the output clock to produce the feedback clock with a frequency $f_{fb}=f_{out}/N$, where N is referred to as the divider's integer divide ratio. When no phase error exists between the reference and feedback clocks, the reference and feedback clock frequencies $f_{ref}$ and $f_{fb}$, respectively, are substantially the same, which in turn locks the frequency $f_{out}$ of the output clock. In other words, $f_{out}=N \cdot f_{fb}=N \cdot f_{ref}$ when the PLL is in steady state.

Integer-N PLLs generate an output clock with a frequency that is an integer multiple N of the reference clock frequency (i.e., $f_{out}=N \cdot f_{ref}$). In contrast a fractional-N PLL (hereinafter fractional PLL) can generate an output clock with a frequency that is a non-integer multiple of the reference frequency $f_{ref}$. This can be done by switching the integer divide ratio between N and N+1 in such a way that the "average" divide ratio is N+K/F. If for F cycles (e.g. F=10 cycles), the divider divides the output clock by N+1 for the first K (e.g., K=7) cycles, and then by N for the last F-K (e.g., 3) cycles, the average divide ratio is N+K/F (e.g., N+7/10), and the average output clock frequency is $f_{out}=(N+K/F) \cdot f_{ref}$.

BRIEF DESCRIPTION OF THE DRAWINGS

The present technology may be better understood, and its numerous objects, features, and advantages made apparent to those skilled in the art by referencing the accompanying drawings.

FIG. 9A illustrates example look-up table that could be employed by the SDM phase noise converter circuit shown in FIG. 7 according to one embodiment of the present disclosure.

The use of the same reference symbols in different drawings indicates similar or identical items.

DETAILED DESCRIPTION

Clock dividers in fractional PLLs are sources of substantial noise (e.g., spurious tones or jitter) that can degrade signal-to-noise ratios of the output to unacceptable levels. This noise, however, can be shifted to higher frequencies if a properly configured, second order or higher sigma-delta modulator (SDM) is added to control the divider. When the divider noise is shifted to higher frequencies, the noise can be attenuated by a lowering the bandwidth of a low-pass loop filter. Unfortunately, a lower bandwidth passes more noise that is attributable to the VCO.

The present disclosure is directed to a system and method for reducing noise in a fractional PLL without having to sacrifice loop filter bandwidth. In one embodiment of the present disclosure, a pulse width correction circuit is added to a fractional PLL and positioned between its phase frequency detector (PFD) and charge pump. The pulse width correction circuit corrects pulse signal output of the PFD by removing phase error attributable to an SDM. A pulse signal has a leading edge at which the signal rapidly changes from a baseline voltage (e.g., 0 V) to another voltage (e.g., 5 V) and a trailing edge at which the signal rapidly returns to the baseline voltage. The time between the leading edge and the trailing edge is the pulse width. In one embodiment, the pulse width correction circuit corrects a pulse signal output by delaying the transmission of its leading edge, but not its trailing edge. In another embodiment, the pulse width correction circuit corrects a pulse signal output by delaying the transmission of its leading and trailing edge, where the transmission delay of the leading edge is dynamic while the transmission delay of the trailing edge is static, but programmable or reprogrammable. In either embodiment, the pulse width correction circuit can negate an increase in pulse width that is due to effects of the SDM, while permitting natural increases in pulse width that are due to normal PLL dynamics. In yet another embodiment the pulse width correction circuit can dynamically delay both the leading and trailing edges of a pulse signal by an equal amount of time Importantly, while the present disclosure will discuss use of the pulse width correction circuit in a fractional PLL, the pulse width correction circuit can be employed in other systems in which the leading and/or trailing edges of a pulse signal are delayed.

Figure 1:
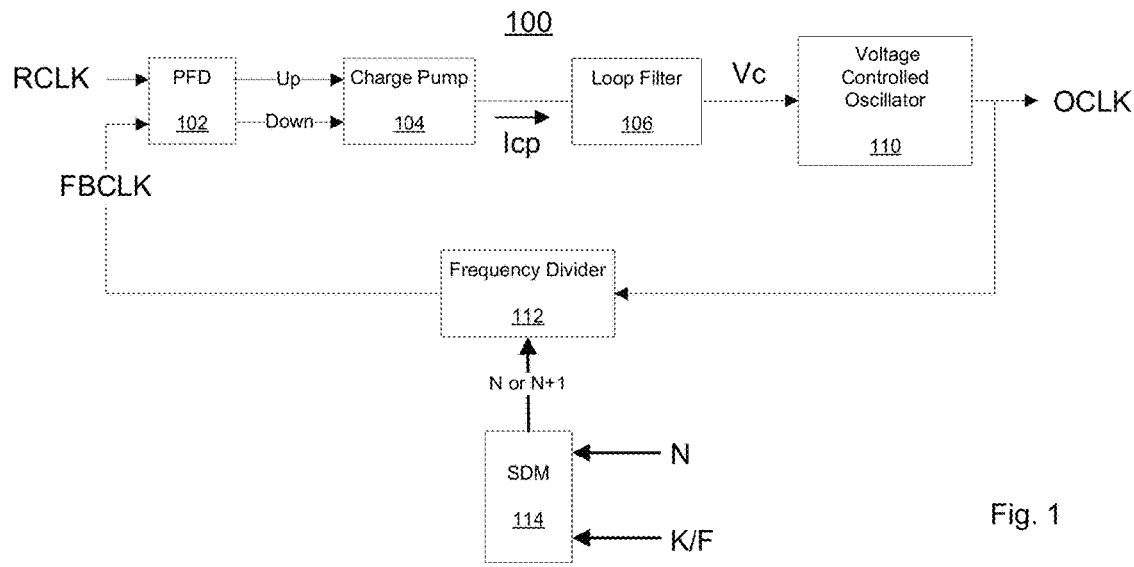
FIG. 1 is a block diagram of an example PLL.

FIG. 1 is a block diagram of an example fractional PLL 100 that includes PFD 102, charge pump 104, low-pass loop filter 106, voltage-controlled oscillator (VCO) 110, divider 112 that provides feedback clock FBCLK, and preferably a second order or higher SDM 114, although a first order SDM is also contemplated. PFD 102 receives feedback clock FBCLK from divider 112. PFD 102 also receives a reference clock RCLK with a predetermined frequency $f_{ref}$ from a crystal oscillator or another suitable signal generator (not shown). PLL 100 generates an output clock OCLK with a frequency $f_{out}$ that tracks the phase, frequency or both of RCLK during the steady state.

Figure 2:
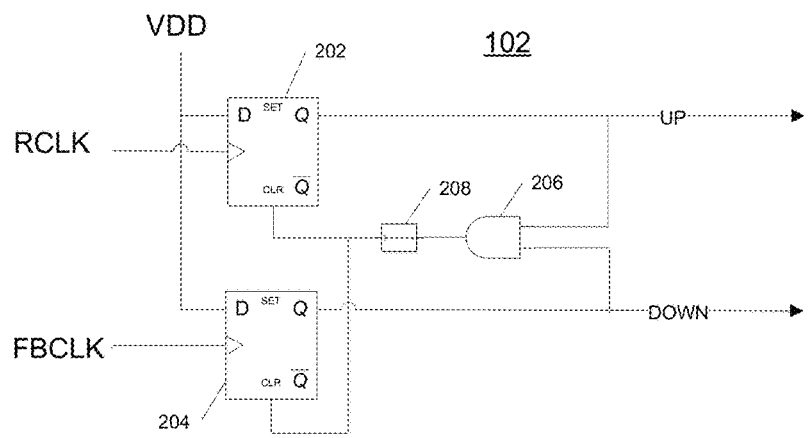
FIG. 2 is a schematic diagram illustrating an example phase-frequency detector employed in the PLL of FIG. 1.

FIG. 2 illustrates one embodiment of PFD, which includes a pair of D flip-flops 202 and 204 that receive RCLK and FBCLK, respectively, at their clock inputs. The D inputs to the flip-flops are connected to supply voltage VDD. Flip-flops 202 and 204 generate "Up" and "Down" pulse signals, respectively. The Up and Down signals are received by AND gate 206. The clear CLR inputs of the flip-flops 202 and 204 are controlled by the output of delay element 208, which receives the output of AND gate 206. In this configuration, the Up and Down outputs of flip-flops 202 and 204 are cleared to low (e.g., 0 V) shortly after Up and Down transition to high (e.g., VDD).

Figure 3A:
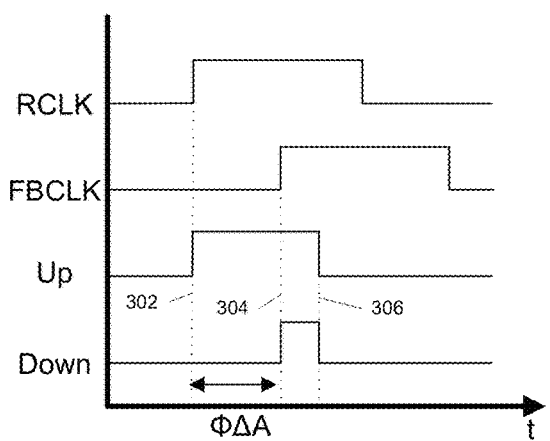
FIGS. 3A and 3B are timing diagrams illustrating operational aspects of the phase-frequency detector.
Figure 3B:
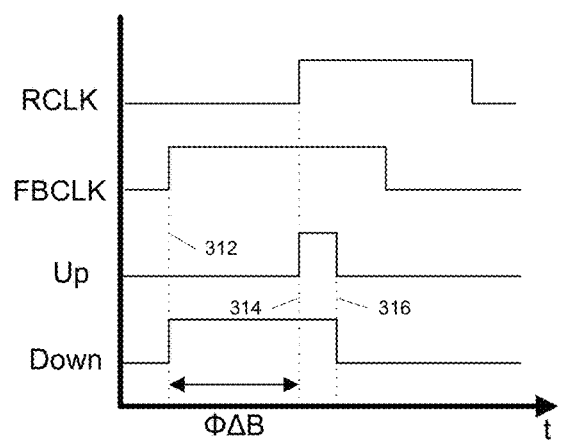

FIGS. 3A and 3B are timing diagrams illustrating operational aspects of PFD 102. More particularly, these figures illustrate Up and Down pulse signals and their relationship to phase error between RCLK and FBCLK. In FIG. 3A the Up signal transitions to high at leading edge 302 of RCLK. The Down signal transitions to high at leading edge 304 of FBCLK. Both Up and Down signals are cleared at 306, which is shortly after Down transitions to high at 304. ΦΔA is the phase error between RCLK and FBCLK in FIG. 3A. Phase error ΦΔA is considered positive since the reference clock RCLK leads the feedback clock FBCLK. FIG. 3B is a timing diagram that shows the opposite, or feedback clock FBCLK leading reference clock RCLK. The Down signal in FIG. 3B transitions to high at the leading edge 312 of FBCLK. The Up signal transitions to high at leading edge 314 of RCLK. Both Up and Down transition are cleared at 316, which is shortly after Up transitions to high at 314. (MB is a negative phase error between the Up and Down signals in FIG. 3B. Phase error ΦΔA or (MB may be attributable to SDM 114 as will be more fully described below.

The Up and Down pulse signals control charge pump 104. Although not shown in FIG. 1, loop filter 106 includes a capacitor C that is charged up or discharged down by the charge pump 104 based on a net difference (i.e., phase error ΦΔ) between the Up and Down pulse signals. A voltage Vc on capacitor C increases or decreases as charge pump 104 adds or removes charge. VCO 110 is controlled by voltage Vc; as Vc increases, the frequency $f_{out}$ of output clock OCLK increases, and vice versa. To illustrate charge pump 104 can charge up capacitor C with positive current Icp during positive phase error ΦΔA shown in FIG. 3A, which in turn increases $f_{out}$. Or charge pump 104 can discharge down capacitor C with negative current Icp during negative phase error (MB shown in FIG. 3B, which in turn decreases $f_{out}$. If no phase error exits (i.e., the Up and Down pulses are equal in timing and duration), then no charge will be added or removed from capacitor C, and both Vc and $f_{out}$ should remain essentially constant.

Figure 4:
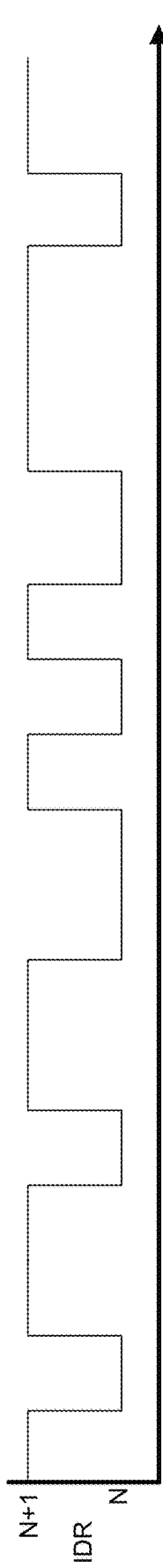
FIG. 4 is a timing diagram that illustrates an example, non-periodic integer divide ratio (IDR) output from the sigma-delta modulator (SDM) of FIG. 1.
Figure 5:
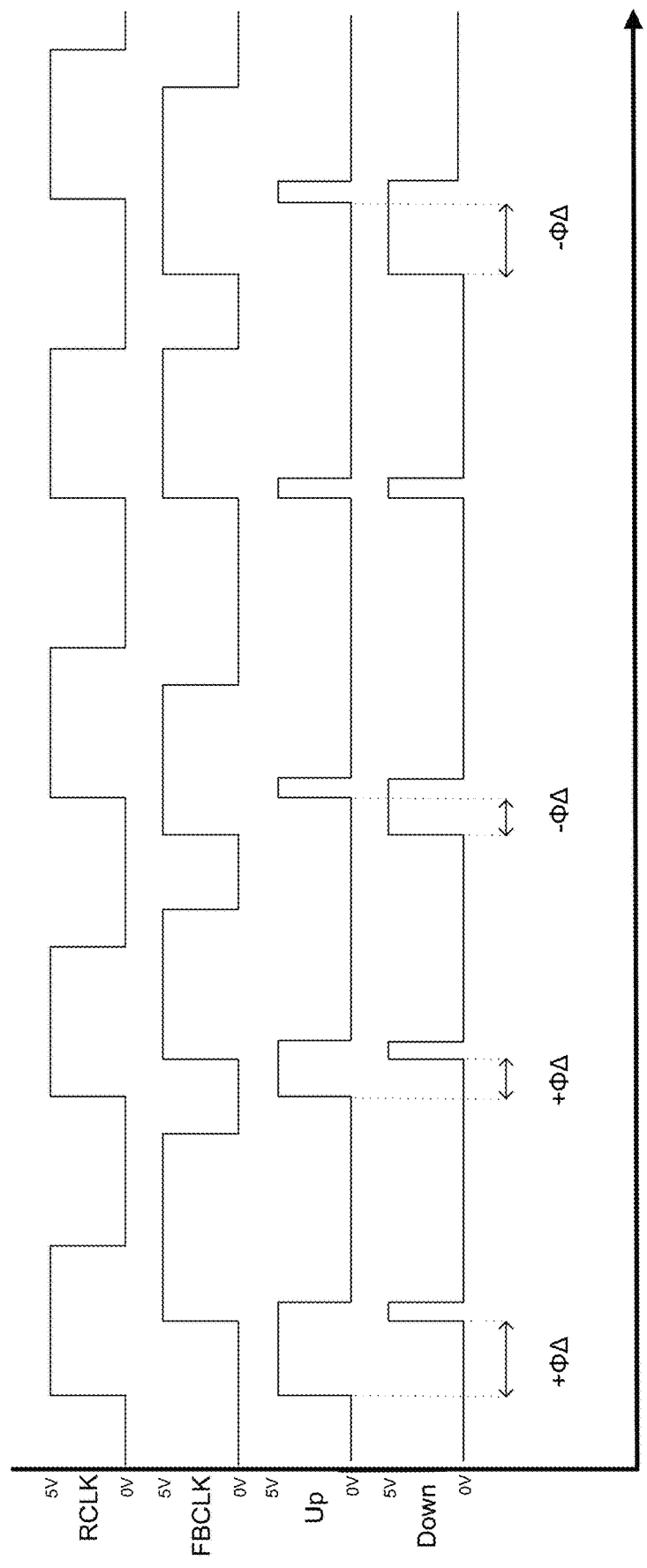
FIG. 5 is a timing diagram that illustrates example Up and Down pulse signals from the phase-frequency detector of FIG. 1.

SDM 114 controls divider 112 by switching its integer divide ratio between N and N+1 in a non-periodic manner FIG. 4 is a timing diagram that illustrates a simplified example of a non-periodic integer divide ratio (IDR) output from SDM 114 that controls divider 112. A time-average of the integer divide ratio should equate to the fractional divide ratio N+K/F input to SDM 114. By varying the percentage of time divider 112 spends dividing OCLK by N versus N+1, the frequency $f_{out}$ of OCLK can be selected with relatively high granularity. Unfortunately, switching between divide ratios N and N+1 causes phase jumping in FBCLK, which leads to random phase error. To illustrate, FIG. 5 is a timing diagram that illustrates example Up and Down pulse signals during steady state (i.e., after the frequency of output clock OCLK essentially settles to $f_{out}=(N+F/K)\cdot f_{ref}$). The frequency $f_{fb}$ of FBCLK changes as the integer divide ratio changes between N and N+1, which in turn creates phase errors ΦΔ. Loop filter capacitor C is charged or discharged via Icp with each of the phase errors ΦΔ, which in turn varies control voltage Vc and creates an unstable output clock OCLK. Loop filter 106 can attenuate the effects on OCLK if the bandwidth of filter 106 is narrowed. But a wide filter bandwidth is preferred since it attenuates VCO noise that also adversely affects OCLK.

Figure 6:
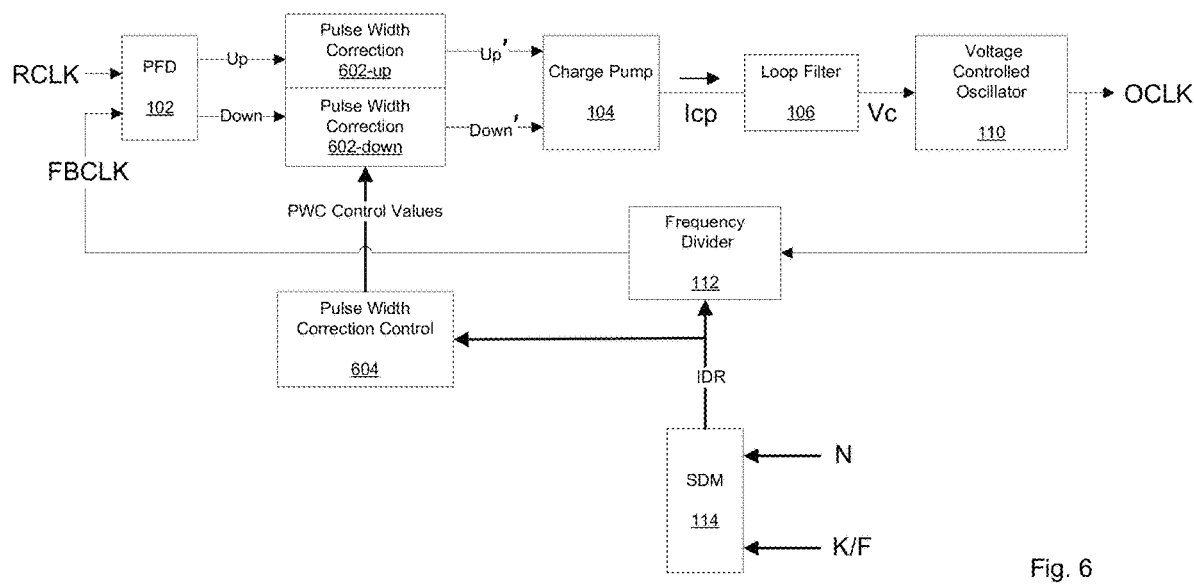
FIG. 6 illustrates the PLL of FIG. 1 with pulse width correction and pulse width correction control circuits added thereto.

The foregoing issues and others can be addressed through use of one or more pulse width correction circuits to remove SDM attributable phase error (hereinafter SDM phase error). FIG. 6 illustrates a fractional PLL employing a pair of pulse width correction circuits according to one embodiment of the present disclosure. More particularly, FIG. 6 shows the fractional PLL 100 of FIG. 1 with pulse width correction circuits 602-up and 602-down, and a pulse width correction control circuit 604. As suggested by its name, pulse width correction control circuit 604 controls pulse width correction circuits 602-up and 602-down via pulse width correction (PWC) control values. The present disclosure will be described with reference to the fractional PLL shown in FIG. 6, it being understood the present disclosure should not be limited thereto.

Pulse width correction circuits 602-up and 602-down can remove substantially all SDM phase error ΦΔ from the Up and Down signals, respectively, of PFD 102. In general, pulse width correction circuits 602-up and 602-down can remove ΦΔ by extending the leading edge on one of the Up and Down signals relative to the other. The pulse width correction circuits 602-up and 602-down remove SDM phase error ΦΔ by delaying the leading and/or trailing edges of the Up and Down signals. A first embodiment will be described with reference to the pulse width correction circuits 602-up and 602-down removing SDM phase error ΦΔ by delaying the leading edges of the Up and Down signals, respectively, but not the trailing edges thereof.

Pulse width correction control circuit 604 can predict a dynamically changing SDM phase error ΦΔ that will be included in each Up or Down pulse signal. To that end, pulse width correction control circuit 604 can generate a predicted SDM phase error PIA. Pulse width correction control circuit 604 can also identify which of the Up or Down pulse signals will include the predicted SDM phase error PIA. Pulse width correction control circuit 604 can then configure the appropriate correction circuit 602-up or 602-down to delay the leading edge of the Up or Down pulse signal by a time value that is approximately equal to D+PΦΔ, where D is a minimum delay value. To illustrate, pulse width correction control circuit 604 may predict the Up signal will include predicted SDM phase error PΦΔ=10 ps. The actual SDM phase error ΦΔ in the Up or Down signal may be slightly less or slightly more than 10 ps. In any event, pulse width correction control circuit 604 configures correction circuit 602-up to delay the leading edge, but not the trailing edge, of the Up signal it receives by approximately D+10 ps. Pulse width correction control circuit 604 also configures correction circuit 602-down to delay the leading edge of the corresponding Down signal by approximately D. One of ordinary skill understands that since the net difference between corresponding Up and Down signals define phase error, delay D that is added to the leading edges of the Up and Down signals will substantially cancel each other at charge pump 104, and as a result D will have no effect on the output clock. For the next cycle, pulse width correction control circuit 604 may predict the Down signal will include a predicted SDM phase error P$\Phi\Delta$=15 ps. In response, pulse width correction control circuit 604 configures correction circuit 602-down to delay the leading edge of the next Down signal by approximately D+15 ps. Pulse width correction control circuit 604 also configures correction circuit 602-up to delay the leading edge of the next Up signal by approximately D. After several cycles, the Up and Down signals should contain little to no SDM phase error, assuming inputs to SDM 114 remain constant.

Figure 7:
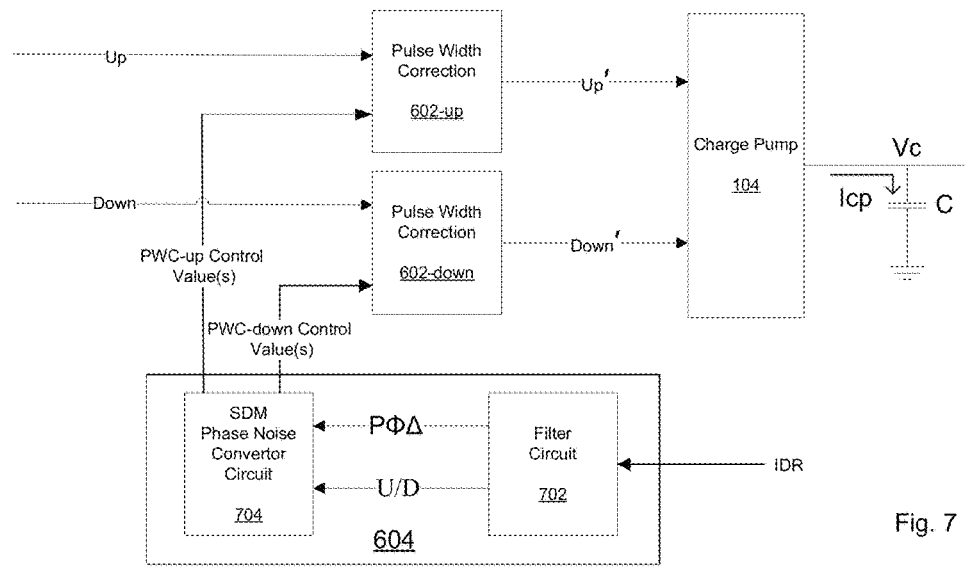
FIG. 7 is a block diagram illustrating one embodiment of the pulse width correction control circuit of FIG. 6.

FIG. 7 illustrates one embodiment of the pulse width correction control circuit 604, which includes filter 702 (e.g., a low pass, single pole filter) and SDM phase noise converter circuit 704. The SDM phase noise converter circuit 704 generates PWC-up control values and PWC-down control values that control the pulse width correction circuits 602-up and 602-down, respectively, based on predicted SDM phase error P$\Phi\Delta$. With continued reference to FIGS. 6 and 7, filter circuit 702 and divider 112 are controlled by SDM 114. Filter circuit 702 simulates the behavior of the PLL loop based on the output from SDM 114. In one embodiment, SDM outputs a string of −1, 0, and +1 values that correspond to IDR values N−1, N, N+1 to filter circuit 702. In one embodiment, the filter circuit 702 tracks phase error accumulation using the output from SDM 114. Filter circuit 702 can generate predicted SDM phase error PIA based on the accumulation and string of −1, 0, and +1 values from SDM 114. Loop filter circuit 702 can also generate a U/D signal that identifies which of the Up and Down pulse signals will include the predicted SDM phase error PIA.

SDM phase noise converter circuit 704 receives the predicted SDM phase error P$\Phi\Delta$ and U/D signal from filter circuit 702 with each cycle of FBCLK. If U/D is set to a positive value, the Up signal should be phase corrected, and if U/D is set to a negative value, the Down signal should be phase corrected. Phase noise converter circuit 704 converts PIA into a pair of PWC control values. SDM phase noise converter circuit 704 may include a combinational logic circuit that converts P$\Phi\Delta$ into PWC control values in accordance with the following:

$$1^{st} \text{ PWC control value} = n + \text{floor}(P\Phi\Delta/n) - \text{mod}(P\Phi\Delta, n) - 1, \text{ and} \quad (1)$$

$$2^{nd} \text{ PWC control value} = \text{mod}(P\Phi\Delta, n), \quad (2)$$

where: n=m+1, and m is the total number of delay cells in a second of two tunable delay circuits that are more fully described below; mod(x,y) is the remainder of the Euclidean division of x by y, where x is the dividend and y is the divisor, and; and floor(x) gives as output the greatest integer less than or equal to x.

In an alternative embodiment, SDM phase noise converter circuit 704 reads the pair of PWC control values from a look-up table (LUT) using P$\Phi\Delta$. The LUT can be populated based on the equations above. An example LUT 902 is described below. The present invention will be described with reference to use of a combinational logic circuit by SDM phase noise convertor 704 to generate the PWC control values.

If the U/D signal is a positive value, the generated $1^{st}$ and $2^{nd}$ PWC control values are provided to pulse width correction circuit 602-up as the PWC-up control values. At the same time SDM phase noise converter 704 provides default PWC control values to pulse width correction circuit 602-down as the PWC-down control values. The default PWC control values are generated using the equations above with P$\Phi\Delta$=0. The default PWC control values are used to configure pulse width correction circuits 602-up or 602-down PWC to delay the leading edge of Up or Down, respectively, by minimum time delay D. If the U/D signal is set to a negative value, the SDM phase noise converter circuit 704 provides the generated $1^{st}$ and $2^{nd}$ PWC control values to pulse width correction circuit 602-down as the PWC-down control values, and SDM phase noise converter circuit 704 provides the default PWC control values (n−2 and 0) to pulse width correction circuit 602-up as the PWC-up control values. Once configured, pulse width correction circuits 602-up and 602-down delay the leading edges, but not the trailing edges, of the Up and Down signals, respectively, by time values corresponding to the PWC-up and PWC-down control values, respectively. SDM phase noise converter circuit 704 can provide new PWC-up and PWC-down control values to pulse width correction circuits with each subsequent cycle of FBCLK.

Figure 8:
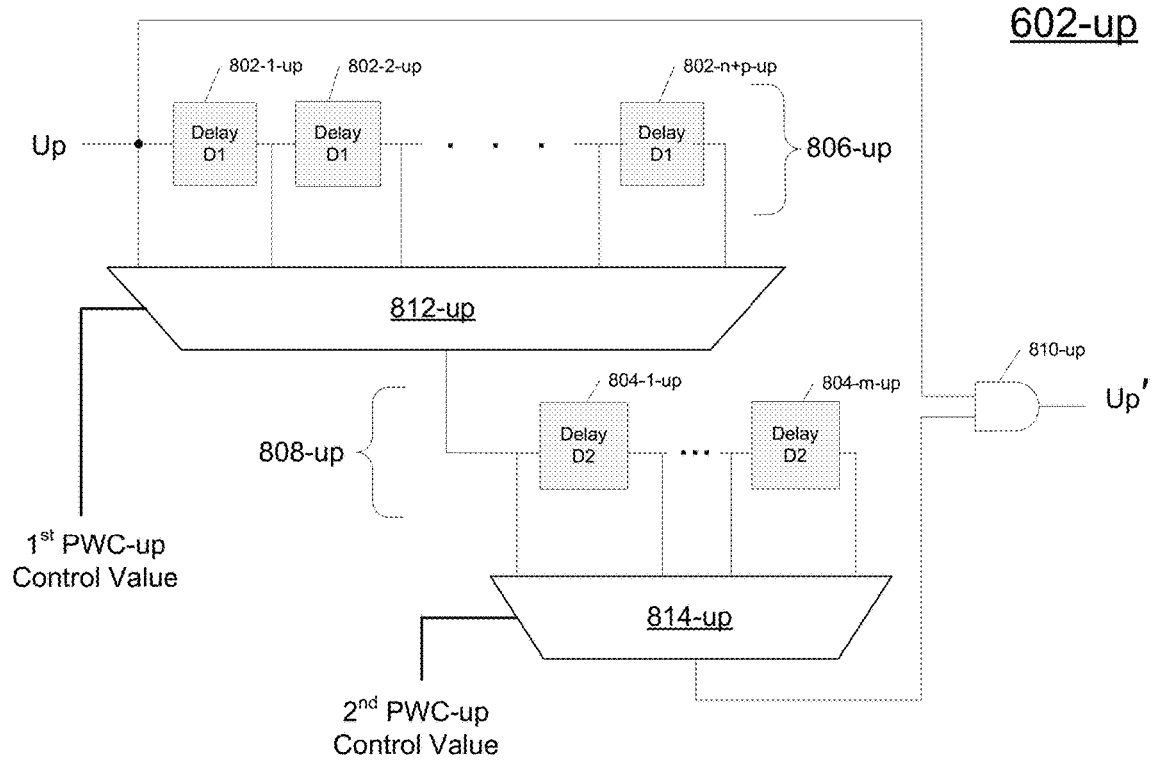
FIG. 8 is a schematic diagram illustrating one embodiment of the pulse width correction circuits of FIG. 6.
Figure 8:
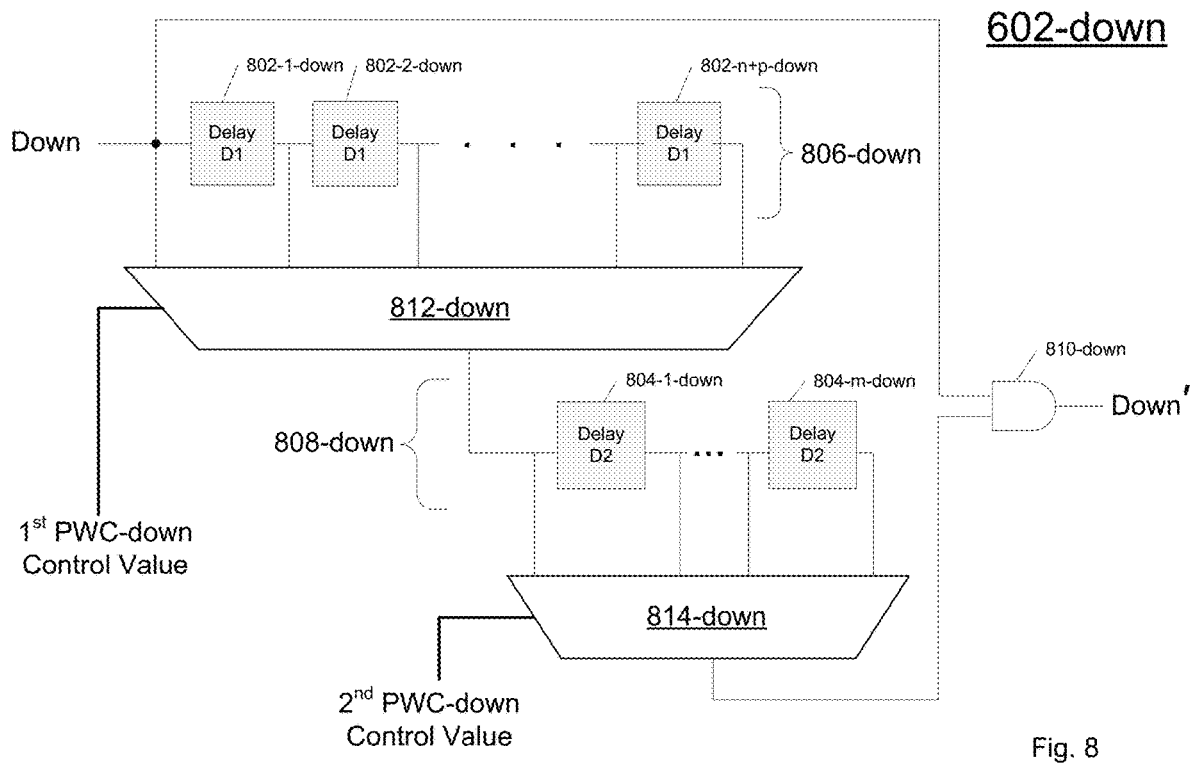

FIG. 8 illustrates example embodiments of configurable pulse width correction circuits 602-up and 602-down, which may also be referred to as pulse adjustment circuits. Pulse width correction circuits 602-up and 602-down are similar in structure. Each correction circuit 602-up and 602-down includes n+p delay elements 802 and m delay elements 804, where n=m+1, m is an integer, and p is an integer that is zero or greater. Delay elements 802 are substantially identical in structure to each other, and delay elements 804 are likewise substantially identical in structure to each other. Each of the pulse width correction circuits 602-up and 602-down is configurable based on the PWC control values it receives. In other words, each pulse width correction circuit 602-up and 602-down delays transmission of a pulse signal input by a time that is determined by the PWC control values it receives.

Each of the delay circuit elements 802 delays the transmission of a pulse signal from its input to its output by time delay D1, while each of the delay elements 804 delays the transmission of a pulse signal from its input to its output by time delay D2. 802 and 804 can be simple buffer delay circuits that can be easily made using standard design and fabrication technology. D1 differs from D2 with D1 preferably less than D2. Edge delay granularity Q of pulse width correction circuits 602-up and 602-down is related D2−D1. For example, with D2=8.0 ps and D1=7.0 ps, Q=D2−D1=1.0 ps. A smaller granularity Q enables pulse width correction circuits 602-up and 602-down to delay transmission of an input pulse signal leading edge with greater granularity, which in turn enables the pulse width correction circuits 602-up and 602-down to remove SDM phase noise with greater precision. On the other hand, a smaller Q may increase n and m, thereby making pulse width correction circuits 602-up and 602-down larger.

The design of the pulse width correction circuits 602-up and 602-down can be based upon desired granularity Q, D1, and/or D2. In one embodiment, chains 806 and 808 can be configured so that n·D1=(n−1)·D2, where n=m+1, and m is the total number of delay elements 804. For a desired Q, n=D2/Q or n=(D1/Q)+1. For example, if Q=1 ps is sought for pulse width correction circuits 602-up and 602-down that contain delay elements 802 and 804 with delays D1=7.0 ps and D2=8.0 ps, respectively, then delay chain 808 may include m=7 delay elements 804, and delay chain 806 should include at least n=8 delay elements 802. Or if Q=0.5 ps is sought for pulse width correction circuits with delays D1=7.5 ps and D2=8.0 ps, then delay chain 808 may include m=15 delay elements 804, and delay chain 806 should include at least n=16 delay elements 802.

The delay elements are arranged in cascaded, programmable delay-element chains 806 and 808. The cascaded configuration enables pulse width correction circuits 602-up and 602-down to quantize edge delay in ascending steps of Q, beginning with a minimum or default delay D=D1·(n−1). For pulse width correction circuit 602-up, delay elements 802-up of chain 806-up are connected in series with the output of one delay element coupled to the input of the next delay element as shown. The first delay element 802-1-up receives the Up signal from PFD 102. Multiplexor 812-up or other similar switching circuit receives the Up signal and the outputs of each of the delay elements 802-up. Multiplexor 812-up is controlled by a $1^{st}$ PWC-up control value from SDM phase noise converter circuit 704. More specifically $1^{st}$ PWC-up control value is a multiplexor tap value that determines which of the n+p inputs to multiplexor 812-up will be connected to its output. Similarly, delay elements 804-up of chain 808-up are connected in series as shown with the output of one delay element coupled to the input to the next delay element. Multiplexor 814-up receives the output of multiplexor 812-up and the outputs of each of the delay elements 804-up. Multiplexor 814-up is controlled by a $2^{nd}$ PWC-up control value from SDM phase noise converter circuit 704. $2^{nd}$ PWC-up control value is also a tap value that determines which of the m inputs to multiplexor 814-up will be connected to its output. AND gate 810-up receives the Up signal and the output of multiplexer 814-up. Pulse width correction circuit 602-up can delay the leading edge of the Up pulse signal input by a time value related to the $1^{st}$ and $2^{nd}$ PWC-up control values. For example, with $1^{st}$ and $2^{nd}$ PWC-up control values equal to 4 and 2, respectively, the fourth input to multiplexor 812-up is connected to its output, and the second input to multiplexor 814-up is connected to its output, and as a result pulse width correction circuit 602-up will transmit the leading edge of the Up signal to AND gate 806-up after the edge is delayed by delay elements 802-1-up, 802-2-up, 802-3-up, and 802-4-up of chain 806-up, and delay elements 804-1-up and 804-2-up of chain 808-up, for a total time delay of 4·D1+2·D2. Up', the output of AND gate 806-up, will transition to high when the output of multiplexor 814-up transitions to high. Pulse width correction circuit 602-up has virtually no delay effect on the trailing edge of any Up signal. In other words, Up' will immediately transition to low at the trailing edge of Up.

Pulse width correction circuit 602-down is similarly configured. Delay elements 802-down of chain 806-down are connected in series with the output of one delay element coupled to the input of the next delay element as shown. The first delay element 802-1-down receives the Down signal from PFD 102. Multiplexor 812-down receives the Down signal and the outputs of each of the delay elements 802-down. Multiplexor 812-down is controlled by a $1^{st}$ PWC-down control value from SDM phase noise converter circuit 704. Similarly, delay elements 804-down are connected in series as shown with the output of one delay element coupled to the input to the next delay element. Multiplexor 814-down receives the output of multiplexor 812-down and the outputs of each of the delay elements 804-down. Multiplexor 814-down is controlled by a $2^{nd}$ PWC-down control value from SDM phase noise converter circuit 704. AND gate 810-down receives the Down signal and the output of multiplexer 814-down. Pulse width correction circuit 602-down can delay the leading edge of Down by a time duration related to the $1^{st}$ and $2^{nd}$ PWC-down control values. For example, with $1^{st}$ and $2^{nd}$ PWC-down control values equal to 6 and 0, respectively, pulse width correction circuit 602-down will transmit the leading edge of the Down signal to AND gate 810-down after the edge is delayed by delay elements 802-1-down-802-6-down, for a total time delay of 6·D1. Down', the output of AND gate 806-down, will transition to high when the output of multiplexor 814-down transitions to high. Down' will immediately transition to low at the trailing edge of Down. Pulse width correction circuit 602-down has virtually no delay effect on the trailing edge of the Down signal.

Figure 9B:
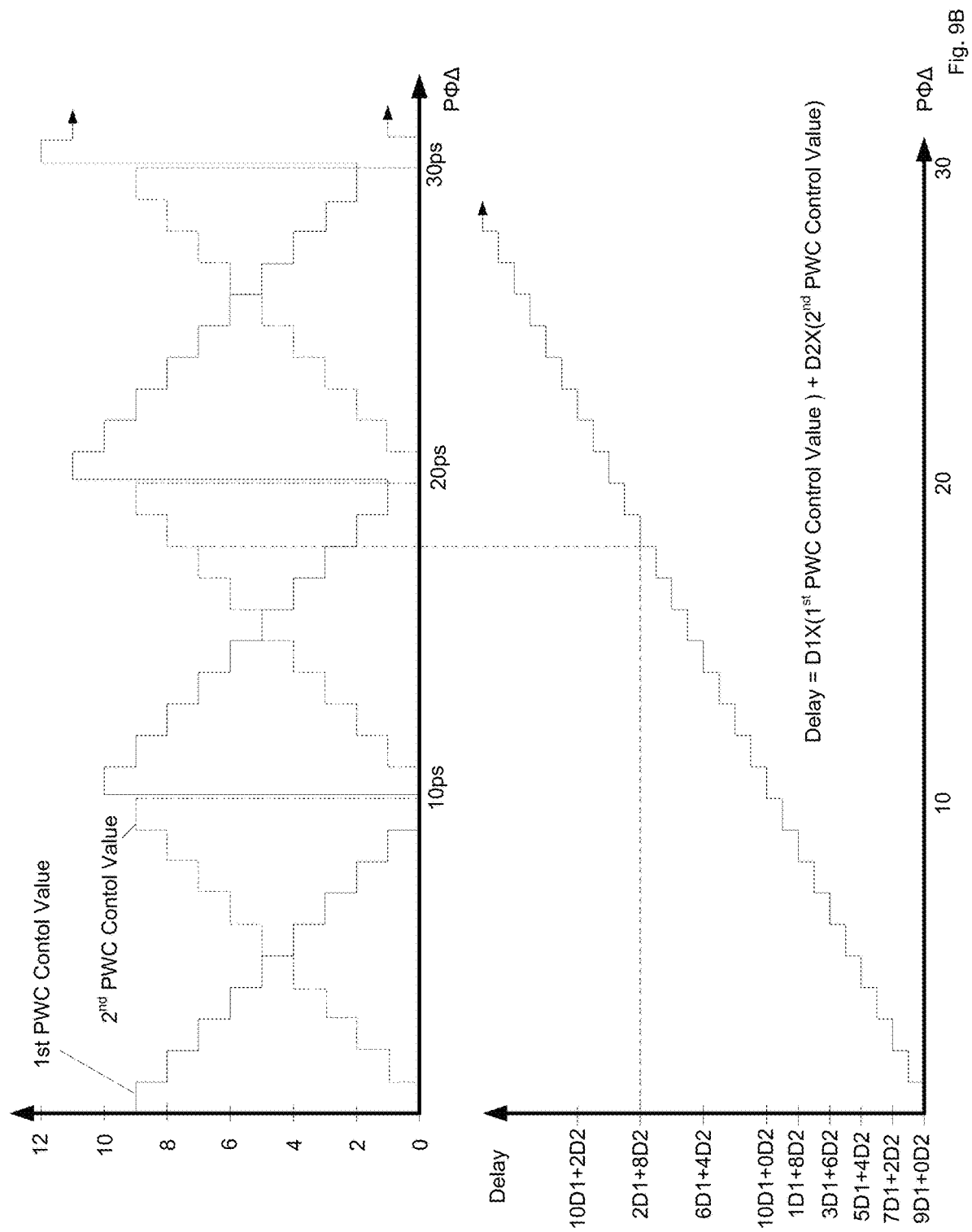
FIG. 9B graphically illustrates the relationship between edge delay that can be introduced by an example pulse width correction and the corresponding PWC control values.

Pulse width correction circuits 602-up and 602-down can be configured with PWC control values that generated based on equations (1) and (2) above. With continuing reference to FIGS. 7 and 8, FIG. 9A illustrates portions of an example LUT 902 that contains PWC control values that are generated in accordance with equations (1) and (2), where D1=7.0 ps, D2=8.0 ps, m=6, and thus n=m+1=7. LUT 902 maps digital values of PΦΔ to pairs of $1^{st}$ and $2^{nd}$ PWC control values, which define tap values for multiplexors 812 and 814, respectively. In one embodiment PΦΔ may be initially generated as a pulse signal by filter circuit 702, and subsequently converted by SDM phase noise converter circuit 704 to a digital signal, which in turn is used to access a LUT to read the $1^{st}$ and $2^{nd}$ PWC control values mapped therein. With U/D set to a positive value, the mapped $1^{st}$ and $2^{nd}$ PWC control values are provided as control inputs to multiplexors 812-up and 814-up, respectively, and default $1^{st}$ and $2^{nd}$ PWC control values (i.e., the $1^{st}$ and $2^{nd}$ PWC control values mapped to PΦΔ=0 ps) are provided to multiplexors 812-down and 814-down, respectively. With U/D set to a negative value, the mapped $1^{st}$ and $2^{nd}$ PWC control values are provided as control inputs to multiplexors 812-down and 814-down, respectively, and the default $1^{st}$ and $2^{nd}$ PWC control values are provided to multiplexors 812-up and 814-up, respectively. The default $1^{st}$ and $2^{nd}$ PWC control values configure pulse width correction circuits 602-up or 602-down to delay the leading edge of the Up and Down signals by delay D. The default delay D depends on D1 and D2 of the delay elements 802 and 804, respectively. For LUT 902, D1=7.0 ps, D2=8.0 ps, and as a result D=42 ps. FIG. 9B graphically illustrates the $1^{st}$ and $2^{nd}$ PWC control values generated by SDM convertor circuit 704 based on PΦΔ for pulse width correction circuits 602-up and 602-down with m=9, and thus n=m+1=10. As seen in the bottom graph of FIG. 9B, the total delay linearly increments by steps of Q=D2−D1 with increasing PΦΔ.

Figure 10:
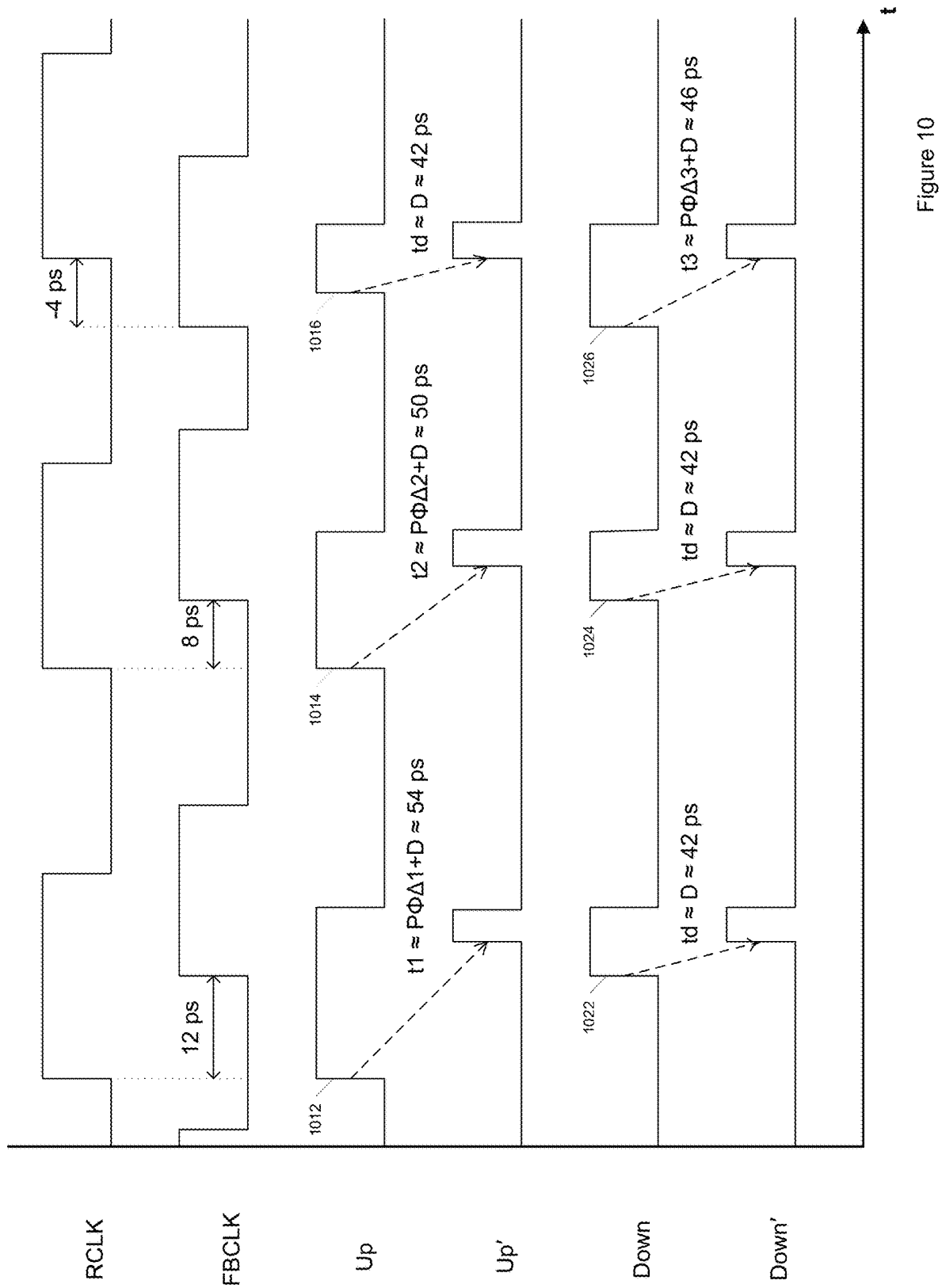
FIG. 10 is a timing diagram illustrating example aspects of the pulse width correction circuits shown in FIG. 8.

With continuing reference to FIGS. 7-9, FIG. 10 illustrates example aspects of pulse width correction circuits 602-up and 602-down according to one embodiment. FIG. 10 shows three corresponding sets of Up and Down signals. FIG. 10 also shows corresponding sets of Up' and Down' pulse signals, which are the Up and Down signals after they are corrected by pulse width correction circuits 602-up and 602-down, respectively. Importantly, the Up' and Down' pulse signals are substantially equal in timing and duration, which means little to no SDM phase error will exist within the Up' and Down' pulse signals. As noted above, charge pump 104 changes Vc based on the phase error. With no phase error, Vc should remain essentially constant.

Before the first full cycle of FBCLK, filter circuit 702 predicts PΦΔ=12 ps will be included in the next Up pulse signal. SDM phase noise converter circuit 704 uses LUT 902 to map PΦΔ=12 ps to $1^{st}$ and $2^{nd}$ PWC-up control values 2 and 5, respectively. SDM phase noise converter circuit 704 configures multiplexors 812-up and 814-up with these $1^{st}$ and $2^{nd}$ PWC-up control values. SDM phase noise converter circuit 704 also configures multiplexors 812-down and 814-down with default $1^{st}$ and $2^{nd}$ PWC-down control values 6 and 0, respectively. Once configured, pulse width correction circuit 602-up will delay the leading edge 1012 by approximately 54 ps, and pulse width correction circuit 602-down will delay the leading edge 1022 with the default minimum time delay D of approximately 42 ps. Prior to start of the next FBCLK cycle, filter circuit 702 predicts PΦΔ=8 ps will be included in the next Up pulse signal. SDM phase noise converter circuit maps PΦΔ=8 ps to $1^{st}$ and $2^{nd}$ PWC-up control values 6 and 1, respectively. SDM phase noise converter circuit 704 configures multiplexors 812-up and 814-up with these $1^{st}$ and $2^{nd}$ PWC-up control values. SDM phase noise converter circuit 704 also configures multiplexors 812-down and 814-down with default $1^{st}$ and $2^{nd}$ PWC-down control values 6 and 0, respectively. Once configured, pulse width correction circuit 602-up will delay the leading edge 1014 by approximately 50 ps, and pulse width correction circuit 602-down will delay the leading edge 1024 by approximately 42 ps. Prior to the start of the last full cycle of FBCLK shown in FIG. 10, filter circuit 702 predicts PΦΔ=4 ps will be included in the next Down pulse signal. SDM phase noise converter circuit 704 uses LUT 902 to map PΦΔ=4 ps to $1^{st}$ and $2^{nd}$ PWC-down control values 2 and 4, respectively. SDM phase noise converter circuit 704 configures multiplexors 812-down and 814-down with these $1^{st}$ and $2^{nd}$ PWC-down control values. SDM phase noise converter circuit 704 also configures multiplexors 812-up and 814-up with default $1^{st}$ and $2^{nd}$ PWC-up control values 6 and 0, respectively. Once configured, pulse width correction circuit 602-down will delay the leading edge 1026 by approximately 46 ps, and pulse width correction circuit 602-up will delay the leading edge 1016 by approximately 42 ps.

Figure 11:
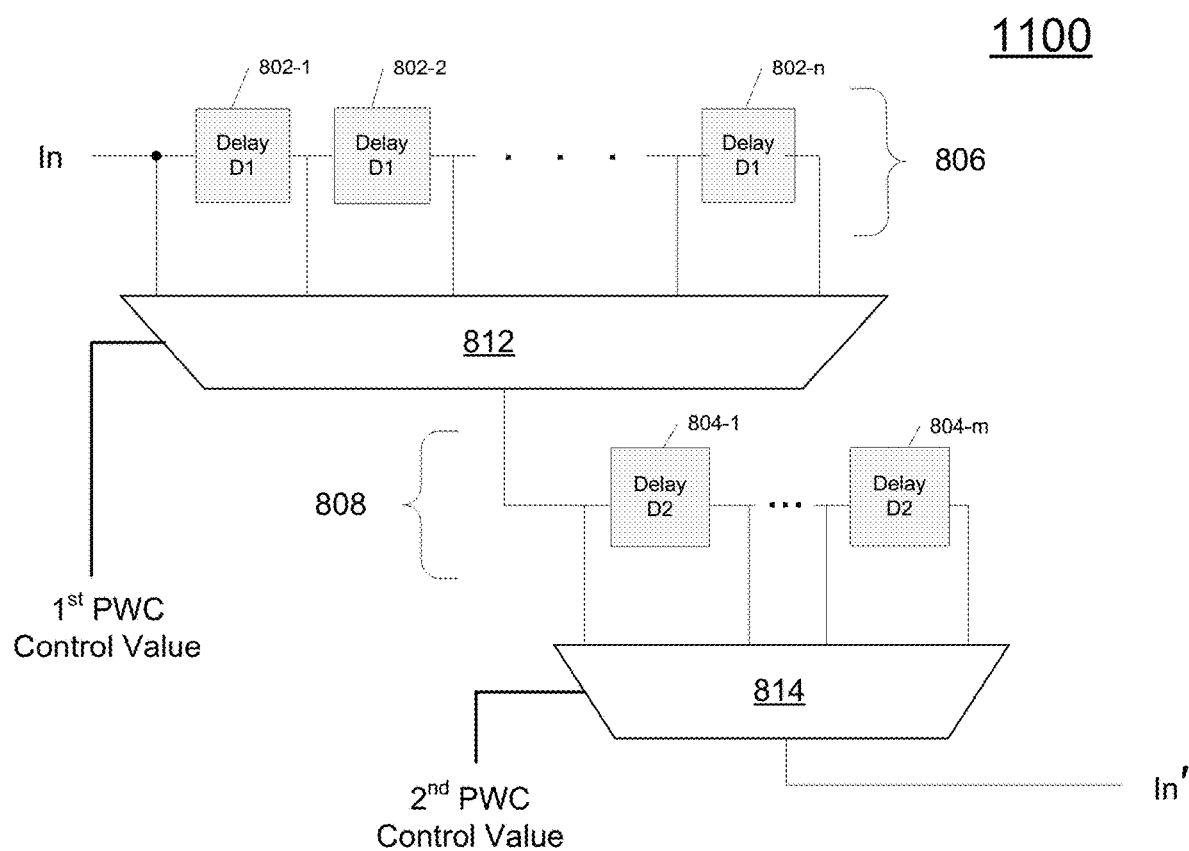
FIG. 11 is a schematic diagram illustrating a pulse width correction circuit that is similar to the pulse width correction circuits shown in FIG. 8, but without the AND gate.

Pulse width correction circuits 602-up and 602-down can delay the leading edge, but not the trailing edge, of Up and Down pulse signals. FIG. 11 shows a delay chain circuit 1100 that is similar to pulse width correction circuits 602-up and 602-down without AND gate 810. Pulse width correction circuit 1100 can be used to delay the leading and trailing edges of an input pulse signal In by a time value corresponding to $1^{st}$ and $2^{nd}$ PWC control values generated in accordance with equations (1) and (2) above.

Figure 12A:
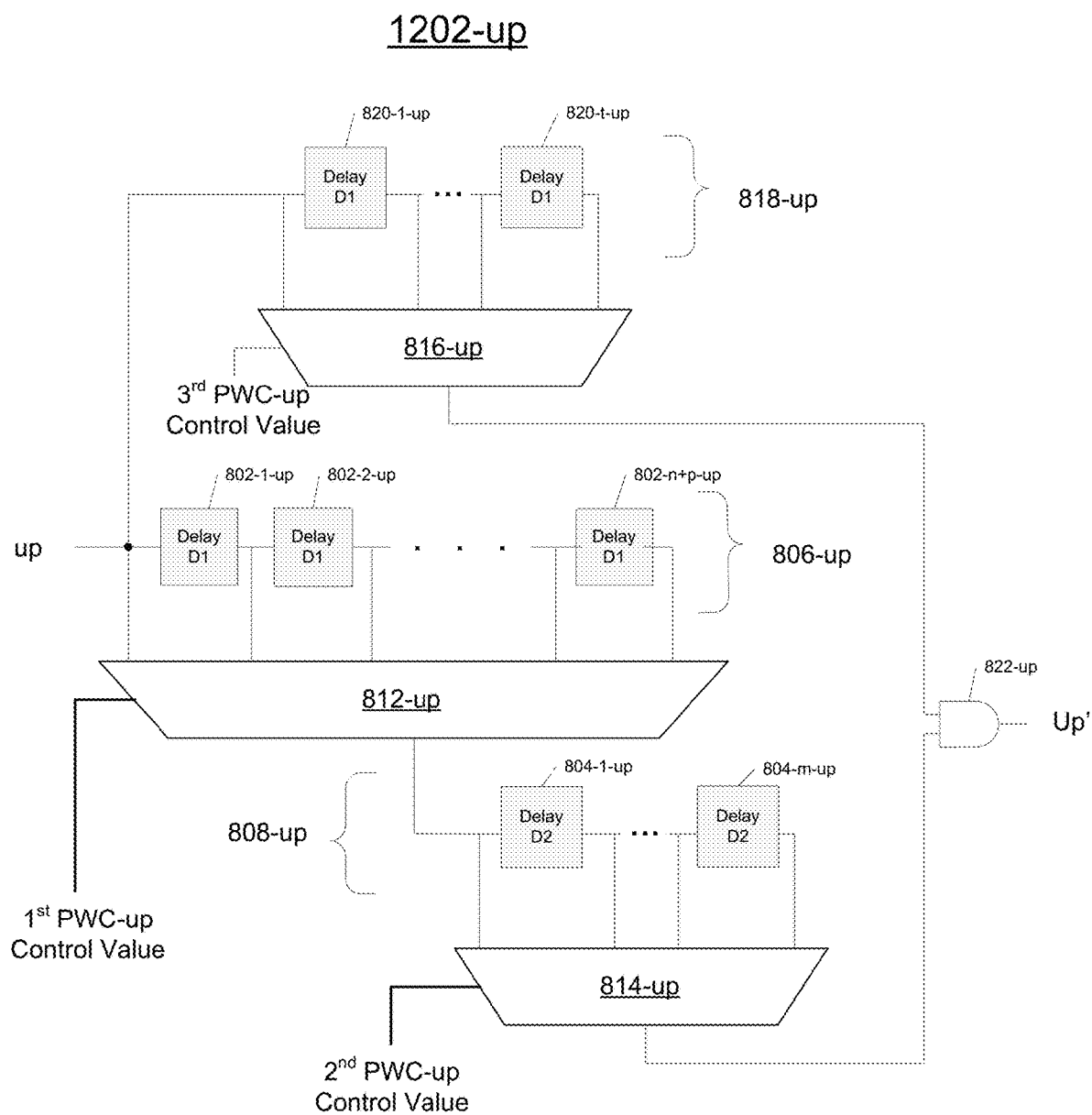
FIG. 12 is a schematic diagram illustrating a pulse width correction circuit according to another embodiment of the present disclosure.
Figure 12B:
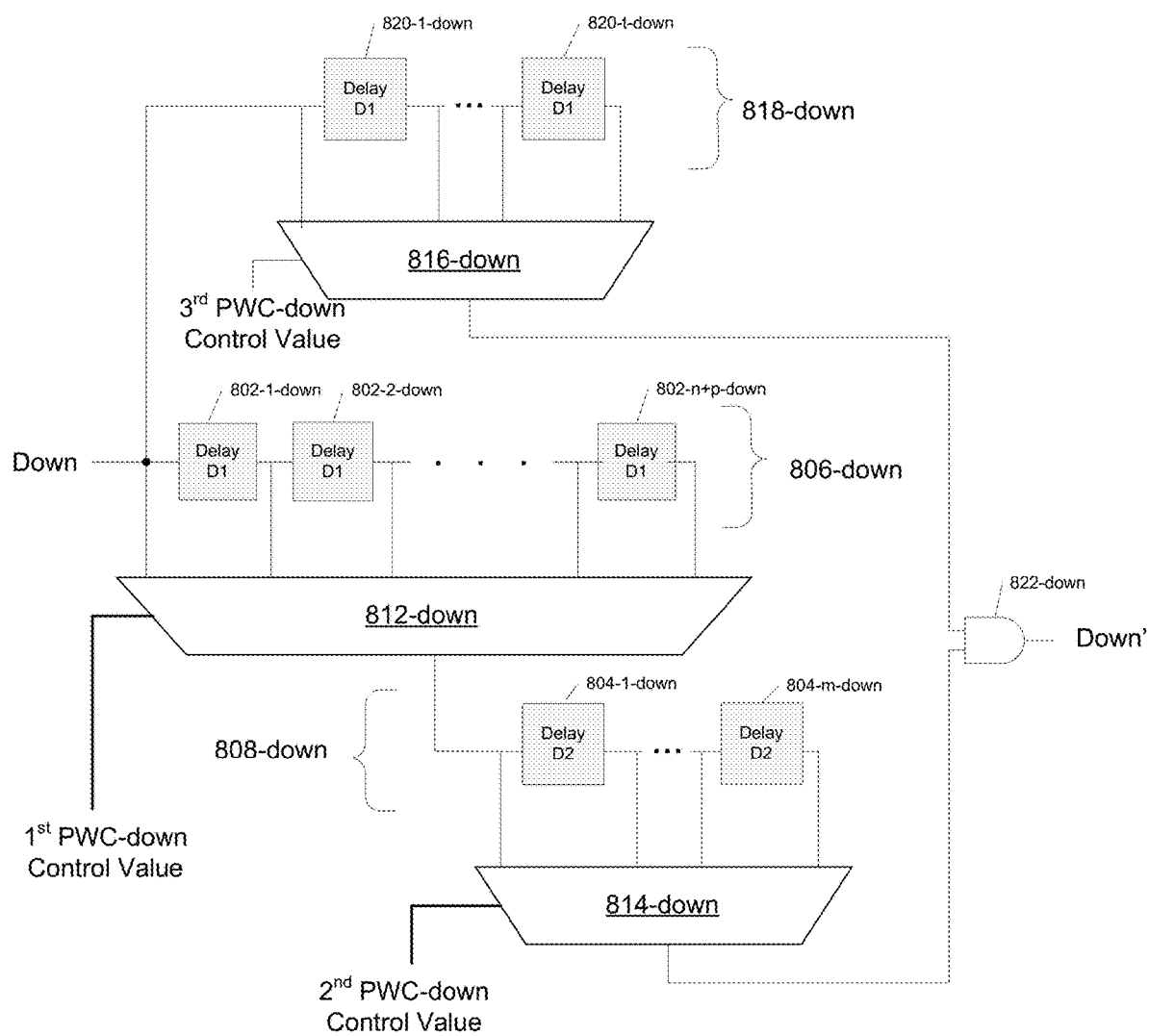

The pulse width correction circuits 602-up and 602-down delay the leading edge of the Up and Down pulses, respectively, but not the trailing edges. In an alternative embodiment the pulse width correction circuits 602-up and 602-down can be replaced by pulse width correction circuits 1202-up and 1202-down, respectively, of FIGS. 12A and 12B, respectively, which delay the leading edges of the Up and Down signals, respectively, in the same fashion as pulse width correction circuits 602-up and 602-down, respectively. However a substantial difference exists between the pulse width correction circuits 1202-up and 1202-down, respectively, of FIGS. 12A and 12B and the pulse width correction circuits 602-up and 602-down shown in FIG. 8. More particularly, pulse width correction circuits 1202-up and 1202-down also delay the trailing edges of the Up and Down signals, respectively, by a configurable time value. As shown in FIGS. 12B and 12A, pulse width correction circuits 1202-up and 1202-down include many of the same elements of pulse width correction circuits 602-up and 602-down. In addition, pulse width correction circuits 1202-up and 1202-down include delay elements 820 arranged in cascaded, programmable delay-element chain 818, the outputs of which are provided to multiplexer 816. Each delay element 820 is shown as having delay D1. Alternatively, each delay element 820 can have a delay other than D1. With reference to FIG. 12A, delay elements 820-up are connected in series with the output of one delay element coupled to the input of the next delay element as shown. The first delay element 820-1-up receives the Up signal from PFD 102. Multiplexor 816-up or other similar switching circuit receives the Up signal and the outputs of each of the delay elements 820-up. Multiplexor 816-up is controlled by a $3^{rd}$ PWC-up control value. More specifically $3^{rd}$ PWC-up control value is a multiplexer tap value that determines which of the t+1 inputs to multiplexor 816-up will be connected to its output, where t is the total number of delay elements 820 in chain 818-up. The output of multiplexor 816-up is provided as an input to AND gate 822-up. Multiplexor 816-up can delay the trailing edge of the Up pulse signal by a time value related to the $3^{rd}$ PWC-up control value. Accordingly, pulse width correction circuit 1202-up can delay both the leading edge and trailing edge of the Up signal. For example, with $1^{st}$ $2^{nd}$ and $3^{rd}$ PWC-up control values equal to 4, 2, and 3, respectively, the fourth input to multiplexor 812-up is connected to its output, the second input to multiplexor 814-up is connected to its output, the third input to multiplexor 816-up is connected to its output, and as a result pulse width correction circuit 1202-up will transmit the leading edge of the Up signal to AND gate 822-up after the edge is delayed by delay elements 802-1-up, 802-2-up, 802-3-up, and 802-4-up of chain 806-up, and delay elements 804-1-up and 804-2-up of chain 808-up, for a total time delay of 4·D1+2·D2. And pulse width correction circuit 1202-up will transmit the trailing edge of the same Up signal to AND gate 822-up after the edge is delayed by delay elements 820-1-up, 820-2-up, and 820-3-up of chain 818-up for a total time delay of 3·D1. Pulse width correction circuit 602-down of FIG. 12B operates in substantially the same manner. In one embodiment, $3^{rd}$ PWC-up and PWC-down control values may be equal. In another embodiment $3^{rd}$ PWC-up and PWC-down control values may be different to accommodate PVT differences between pulse width correction circuits 1202-up and 1202-down, which would otherwise create time differences in default delays D between pulse width correction circuits 1202-up and 1202-down. With $3^{rd}$ PWC-up and PWC-down control values greater than zero, Up' and Down' pulses will have a default delay D greater than n·D1. The $3^{rd}$ PWC-up and PWC-down control values can remain constant during operation of the PLL. Or, the $3^{rd}$ PWC-up and PWC-down control values can be changed to accommodate, for example, a change in the environment in which the PLL operates.

An apparatus is disclosed that includes a phase detector circuit for generating a first pulse signal based on first and second input clock signals, a first circuit for adjusting the first pulse signal by delaying transmission of a leading edge of the first pulse signal, but not a trailing edge of the first pulse signal, a charge pump circuit for charging or discharging a capacitor based on the adjusted first pulse signal, and a voltage-controlled oscillator (VCO) circuit for generating an output clock signal with a frequency that depends on a voltage on the capacitor. In one embodiment, the apparatus may further include a second circuit, wherein the phase detector is configured to generate a second pulse signal, wherein the second circuit is configured to adjust the second pulse by delaying transmission of a leading edge of the second pulse signal, but not the trailing edge of the second pulse signal, and wherein the charge pump is configured to charge or discharge the capacitor based on the adjusted first and second pulse signals. The first circuit may be configured to delay transmission of the leading edge of the first pulse signal by a first time duration, the second circuit can be configured to delay transmission of the leading edge of the second pulse signal by a second time duration, wherein the first and second time durations are different from each other. The first circuit in this embodiment may include a first circuit input configured to receive the first pulse signal, a first circuit output, first delay circuits coupled in series, each of which is configured to delay signal transmission by a first predetermined amount of time, wherein an input of one of the first delay circuits is coupled to the first circuit input, a first multiplexor comprising inputs coupled to respective outputs of the first delay circuits and the first circuit input, wherein the first multiplexor is configured to receive a first multibit control value, wherein the first multiplexor is configured to connect one of its inputs to its output based on the first multibit control value, second delay circuits coupled in series, each of which is configured to delay signal transmission by a second predetermined amount of time, wherein the first and second predetermined amount of times are different from each other, wherein an input of one of the second delay circuits is coupled to an output of the first multiplexor, a second multiplexor comprising inputs coupled to respective outputs of the second delay circuits and the output of the first multiplexor, wherein the second multiplexor is configured to receive a second multibit control value, wherein the second multiplexor is configured to connect one of its inputs to its output based on the second multibit control value, and a first AND gate comprising inputs coupled to the first circuit input and an output of the second multiplexor. In one embodiment the first circuit may include a first circuit input configured to receive the first pulse signal, a first circuit output, first delay circuits coupled in series, each of which is configured to delay signal transmission by a first predetermined amount of time, wherein an input of one of the first delay circuits is coupled to the first circuit input, a first multiplexor comprising inputs coupled to respective outputs of the first delay circuits and the first circuit input, wherein the first multiplexor is configured to receive a first multibit control value, wherein the first multiplexor is configured to connect one of its inputs to its output based on the first multibit control value, second delay circuits coupled in series, each of which is configured to delay signal transmission by a second predetermined amount of time, which is greater than the first predetermined amount of time, wherein an input of one of the second delay circuits is coupled to an output of the first multiplexor, a second multiplexor comprising inputs coupled to respective outputs of the second delay circuits and the output of the first multiplexor, wherein the second multiplexor is configured to receive a second multibit control value, wherein the second multiplexor is configured to connect one of its inputs to its output based on the second multibit control value, a first AND gate comprising inputs coupled to the first circuit input and an output of the second multiplexor, wherein the second circuit may include a second circuit input configured to receive the second pulse signal, a second circuit output, third delay circuits coupled in series, each of which is configured to delay signal transmission by the first predetermined amount of time, wherein an input of one of the third delay circuits is coupled to the second circuit input, a third multiplexor comprising inputs coupled to respective outputs of the third delay circuits and the second circuit input, wherein the third multiplexor is configured to receive a third multibit control value, wherein the third multiplexor is configured to connect one of its inputs to its output based on the third multibit control value, fourth delay circuits coupled in series, each of which is configured to delay signal transmission by the second predetermined amount of time, wherein an input of one of the fourth delay circuits is coupled to an output of the third multiplexor, wherein the fourth multiplexor is configured to connect one of its inputs to its output based on the fourth multibit control value, a fourth multiplexor comprising inputs coupled to respective outputs of the fourth delay circuits and the output of the third multiplexor, wherein the fourth multiplexor is configured to receive a fourth multibit control value, and a second AND gate comprising inputs coupled to the second circuit input and an output of the fourth multiplexor. In one embodiment, the apparatus further includes a clock divider circuit coupled between the VCO circuit and the phase detector circuit, wherein the clock divider circuit is configured to generate the second clock input signal based on the output clock signal and an integer divide ratio value, and a sigma delta modulator (SDM) circuit for generating the divide ratio value based on integer and fractional input values N and F/K, respectively. The apparatus may further include a clock divider circuit coupled between the VCO circuit and the phase detector circuit, wherein the clock divider circuit is configured to generate the second clock input signal based on the output clock signal and an integer divide ratio value, and a sigma delta modulator (SDM) circuit for generating the divide ratio value based on integer and fractional input values N and F/K, respectively.

Another apparatus is disclosed that includes a first circuit having a first signal input, a first control input for receiving a first multibit control value, a second control input for receiving a second multibit control value, first delay circuits coupled in series, each of which is configured to delay signal transmission by a first predetermined amount of time, wherein an input of one of the first delay circuits is coupled to the first signal input, a first multiplexor comprising inputs coupled to respective outputs of the first delay circuits and the first signal input, wherein the first multiplexor is configured to receive the first multibit control value, wherein the first multiplexor is configured to connect one of its inputs to its output based on the first multibit control value, second delay circuits coupled in series, each of which is configured to delay signal transmission by a second predetermined amount of time, which is greater or less than the first predetermined amount of time, wherein an input of one of the second delay circuits is coupled to an output of the first multiplexor, and a second multiplexor comprising inputs coupled to respective outputs of the second delay circuits and the output of the first multiplexor, wherein the second multiplexor is configured to receive a second multibit control value, wherein the second multiplexor is configured to connect one of its inputs to its output based on the second multibit control value. The first circuit further include a first AND gate comprising inputs coupled to the first signal input and an output of the second multiplexor. The other apparatus may include a phase detector circuit for generating a first pulse signal based on first and second input clock signals, wherein the first signal input is configured to receive the first pulse signal. The other apparatus may further include a voltage controlled oscillator (VCO) circuit for generating an output clock signal with a frequency that depends on a signal output of the first AND gate. The other apparatus may further include a second circuit, wherein the phase detector circuit is configured to generate a second pulse signal based on the first and second input clock signals. And the second circuit in this embodiment may include a second signal input configured to receive the second pulse signal, a third control input for receiving a third multibit control value, a fourth control input for receiving a fourth multibit control value, third delay circuits coupled in series, each of which is configured to delay signal transmission by the first predetermined amount of time, wherein an input of one of the third delay circuits is coupled to the second signal input, a third multiplexor comprising inputs coupled to respective outputs of the third delay circuits and to the second signal input, wherein the third multiplexor is configured to receive the third multibit control value, wherein the third multiplexor is configured to connect one of its inputs to its output based on the third multibit control value, fourth delay circuits coupled in series, each of which is configured to delay signal transmission by the second predetermined amount of time, wherein an input of one of the fourth delay circuits is coupled to an output of the third multiplexor, a fourth multiplexor comprising inputs coupled to respective outputs of the fourth delay circuits and the output of the third multiplexor, wherein the fourth multiplexor is configured to receive a fourth multibit control value, wherein the fourth multiplexor is configured to connect one of its inputs to its output based on the fourth multibit control value, and a second AND gate comprising inputs coupled to the second signal input and an output of the fourth multiplexor. The other apparatus might include a charge pump circuit coupled to receive the output signals of the first and second AND gates and configured to charge or discharge a capacitor based on the output signals of the first and second AND gates, wherein the capacitor is coupled to an input of the VCO circuit.

Yet another apparatus may include a circuit for generating a first pulse signal based on first and second input signals, a first configurable delay circuit for adjusting the first pulse signal by delaying transmission of a leading edge of the first pulse signal by a time value that corresponds to first and second control values, and by delaying a trailing edge of the first pulse signal by a time value that corresponds to a third control value. In this apparatus, the first configurable delay circuit may include a first circuit input configured to receive the first pulse signal, a plurality of first delay circuits, each of which is configured to delay signal transmission by a first delay time, wherein first delay circuits are coupled in series, wherein an input of one of the first delay circuits is coupled to the first circuit input, a first switching device that is controlled by the first control value, wherein the first switching device comprises inputs coupled to respective outputs of the first delay circuits and the first circuit input, wherein the first switching device is configured to connect one of its inputs to its output based on the first control value, a plurality of second delay circuits, each of which is configured to delay signal transmission by a second delay time, which is different than the first delay time, wherein the second delay circuits are coupled in series, wherein an input of one of the second delay circuits is coupled to an output of the first switching device, a second switching device that is controlled by the second control value, wherein the second switching device comprises inputs coupled to respective outputs of the second delay circuits and the output of the first switching device, wherein the second switching device is configured to connect one of its inputs to its output based on the second control value, a plurality of third delay circuits, each of which is configured to delay signal transmission by a third delay time, wherein the third circuits are coupled in series, wherein an input of one of the third delay circuits is coupled to the first circuit input, a third switching device that is controlled by the third control value, wherein the third switching device comprises inputs coupled to respective outputs of the third delay circuits and the first circuit input, wherein the third switching device is configured to connect one of its inputs to its output based on the third control value, and a first AND gate coupled to the outputs of the second and third switching devices. In this version, the apparatus may further include a second configurable delay circuit for adjusting a second pulse signal, wherein the second configurable delay circuit comprises, a second circuit input configured to receive the second pulse signal, a plurality of fourth delay circuits, each of which is configured to delay signal transmission by the first delay time, wherein the fourth delay circuits are coupled in series, wherein an input of one of the fourth delay circuits is coupled to the second circuit input, a fourth switching device that is controlled by a fourth control value, wherein the fourth switching device comprises inputs coupled to respective outputs of the fourth delay circuits and the second circuit input, wherein the fourth switching device is configured to connect one of its inputs to its output based on the fourth control value, a plurality of fifth delay circuits, each of which is configured to delay signal transmission by the second delay time, wherein fifth delay circuits are coupled in series, wherein an input of one of the fifth delay circuits is coupled to the output of the fourth switching device, a fifth switching device that is controlled by a fifth control value, wherein the fifth switching device comprises inputs coupled to respective outputs of the fifth delay circuits and the output of the fourth switching device, wherein the fifth switching device is configured to connect one of its inputs to its output based on the fifth control value, a plurality of sixth delay circuits, each of which is configured to delay signal transmission by the third delay time, wherein the sixth delay circuits are coupled in series, wherein an input of one of the sixth delay circuits is coupled to the second circuit input, a sixth switching device that is controlled by a sixth control value, wherein the third switching device comprises inputs coupled to respective outputs of the third delay circuits and the first circuit input, wherein the third switching device is configured to connect one of its inputs to its output based on the sixth control value, and a second AND gate coupled to the outputs of the fifth and sixth switching devices. The second and third delay times can be equal. This embodiment may further include a voltage-controlled oscillator (VCO) circuit, a charge pump circuit coupled to receive output signals of the first and second AND gates and configured to charge or discharge a capacitor based on the output signals of the first and second AND gates, wherein the capacitor is coupled to an input of the VCO circuit. In an embodiment, the circuit is configured for generating a second pulse signal based on the first and second input signals, and a a second configurable delay circuit may be provided for adjusting the second pulse signal by delaying transmission of a leading edge of the second pulse signal by a time value that corresponds to fourth and fifth control values, and by delaying a trailing edge of the second pulse signal by a time value that corresponds to a sixth control value. Lastly, this apparatus may include a voltage controlled oscillator (VCO) circuit that generates an output clock with a frequency that depends on the first and second pulse signals after they are adjusted by the first and second configurable delay circuits, respectively.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. An apparatus comprising:
a phase detector circuit for generating a first pulse signal based on first and second input clock signals;
a first circuit for adjusting the first pulse signal by delaying transmission of a leading edge of the first pulse signal, but not a trailing edge of the first pulse signal;
a charge pump circuit for charging or discharging a capacitor based on the adjusted first pulse signal;
a voltage-controlled oscillator (VCO) circuit for generating an output clock signal with a frequency that depends on a voltage on the capacitor.

2. The apparatus of claim 1 further comprising:
a second circuit;
wherein the phase detector is configured to generate a second pulse signal;
wherein the second circuit is configured to adjust the second pulse by delaying transmission of a leading edge of the second pulse signal, but not the trailing edge of the second pulse signal;
wherein the charge pump is configured to charge or discharge the capacitor based on the adjusted first and second pulse signals.

3. The apparatus of claim 2:
wherein the first circuit is configured to delay transmission of the leading edge of the first pulse signal by a first time duration;
wherein the second circuit is configured to delay transmission of the leading edge of the second pulse signal by a second time duration;
wherein the first and second time durations are different from each other.

4. The apparatus of claim 1 wherein the first circuit comprises:
a first circuit input configured to receive the first pulse signal;
a first circuit output;
first delay circuits coupled in series, each of which is configured to delay signal transmission by a first predetermined amount of time, wherein an input of one of the first delay circuits is coupled to the first circuit input;
a first multiplexor comprising inputs coupled to respective outputs of the first delay circuits and the first circuit input, wherein the first multiplexor is configured to receive a first multibit control value, wherein the first multiplexor is configured to connect one of its inputs to its output based on the first multibit control value;
second delay circuits coupled in series, each of which is configured to delay signal transmission by a second predetermined amount of time, wherein the first and second predetermined amount of times are different from each other, wherein an input of one of the second delay circuits is coupled to an output of the first multiplexor;
a second multiplexor comprising inputs coupled to respective outputs of the second delay circuits and the output of the first multiplexor, wherein the second multiplexor is configured to receive a second multibit control value, wherein the second multiplexor is configured to connect one of its inputs to its output based on the second multibit control value, and;
a first AND gate comprising inputs coupled to the first circuit input and an output of the second multiplexor.

5. The apparatus of claim 2:
wherein the first circuit comprises:
a first circuit input configured to receive the first pulse signal;
a first circuit output;
first delay circuits coupled in series, each of which is configured to delay signal transmission by a first predetermined amount of time, wherein an input of one of the first delay circuits is coupled to the first circuit input;
a first multiplexor comprising inputs coupled to respective outputs of the first delay circuits and the first circuit input, wherein the first multiplexor is configured to receive a first multibit control value, wherein the first multiplexor is configured to connect one of its inputs to its output based on the first multibit control value;
second delay circuits coupled in series, each of which is configured to delay signal transmission by a second predetermined amount of time, which is greater than the first predetermined amount of time, wherein an input of one of the second delay circuits is coupled to an output of the first multiplexor;
a second multiplexor comprising inputs coupled to respective outputs of the second delay circuits and the output of the first multiplexor, wherein the second multiplexor is configured to receive a second multibit control value, wherein the second multiplexor is configured to connect one of its inputs to its output based on the second multibit control value;
a first AND gate comprising inputs coupled to the first circuit input and an output of the second multiplexor;
wherein the second circuit comprises:
a second circuit input configured to receive the second pulse signal;
a second circuit output;
third delay circuits coupled in series, each of which is configured to delay signal transmission by the first predetermined amount of time, wherein an input of one of the third delay circuits is coupled to the second circuit input;
a third multiplexor comprising inputs coupled to respective outputs of the third delay circuits and the second circuit input, wherein the third multiplexor is configured to receive a third multibit control value, wherein the third multiplexor is configured to connect one of its inputs to its output based on the third multibit control value;
fourth delay circuits coupled in series, each of which is configured to delay signal transmission by the second predetermined amount of time, wherein an input of one of the fourth delay circuits is coupled to an output of the third multiplexor, wherein the fourth multiplexor is configured to connect one of its inputs to its output based on the fourth multibit control value;
a fourth multiplexor comprising inputs coupled to respective outputs of the fourth delay circuits and the output of the third multiplexor, wherein the fourth multiplexor is configured to receive a fourth multibit control value, and;
a second AND gate comprising inputs coupled to the second circuit input and an output of the fourth multiplexor.

6. The apparatus of claim 4 further comprising:
a clock divider circuit coupled between the VCO circuit and the phase detector circuit, wherein the clock divider circuit is configured to generate the second clock input signal based on the output clock signal and an integer divide ratio value;
a sigma delta modulator (SDM) circuit for generating the divide ratio value based on integer and fractional input values N and F/K, respectively.

7. The apparatus of claim 5 further comprising:
a clock divider circuit coupled between the VCO circuit and the phase detector circuit, wherein the clock divider circuit is configured to generate the second clock input signal based on the output clock signal and an integer divide ratio value;
a sigma delta modulator (SDM) circuit for generating the divide ratio value based on integer and fractional input values N and F/K, respectively.

8. An apparatus comprising:
a first circuit comprising:
a first signal input;
a first control input for receiving a first multibit control value;
a second control input for receiving a second multibit control value;
first delay circuits coupled in series, each of which is configured to delay signal transmission by a first predetermined amount of time, wherein an input of one of the first delay circuits is coupled to the first signal input;
a first multiplexor comprising inputs coupled to respective outputs of the first delay circuits and the first signal input, wherein the first multiplexor is configured to receive the first multibit control value, wherein the first multiplexor is configured to connect one of its inputs to its output based on the first multibit control value;
second delay circuits coupled in series, each of which is configured to delay signal transmission by a second predetermined amount of time, which is greater or less than the first predetermined amount of time, wherein an input of one of the second delay circuits is coupled to an output of the first multiplexor, and;
a second multiplexor comprising inputs coupled to respective outputs of the second delay circuits and the output of the first multiplexor, wherein the second multiplexor is configured to receive a second multibit control value, wherein the second multiplexor is configured to connect one of its inputs to its output based on the second multibit control value.

9. The apparatus of claim 8 wherein the first circuit further comprises a first AND gate comprising inputs coupled to the first signal input and an output of the second multiplexor.

10. The apparatus of claim 9 further comprising:
a phase detector circuit for generating a first pulse signal based on first and second input clock signals;
wherein the first signal input is configured to receive the first pulse signal.

11. The apparatus of claim 10 further comprising a voltage controlled oscillator (VCO) circuit for generating an output clock signal with a frequency that depends on a signal output of the first AND gate.

12. The apparatus of claim 11 further comprising:
a second circuit;
wherein the phase detector circuit is configured to generate a second pulse signal based on the first and second input clock signals;
wherein the second circuit comprises:
a second signal input configured to receive the second pulse signal;
a third control input for receiving a third multibit control value;
a fourth control input for receiving a fourth multibit control value;
third delay circuits coupled in series, each of which is configured to delay signal transmission by the first predetermined amount of time, wherein an input of one of the third delay circuits is coupled to the second signal input;
a third multiplexor comprising inputs coupled to respective outputs of the third delay circuits and to the second signal input, wherein the third multiplexor is configured to receive the third multibit control value, wherein the third multiplexor is configured to connect one of its inputs to its output based on the third multibit control value;
fourth delay circuits coupled in series, each of which is configured to delay signal transmission by the second predetermined amount of time, wherein an input of one of the fourth delay circuits is coupled to an output of the third multiplexor;
a fourth multiplexor comprising inputs coupled to respective outputs of the fourth delay circuits and the output of the third multiplexor, wherein the fourth multiplexor is configured to receive a fourth multibit control value, wherein the fourth multiplexor is configured to connect one of its inputs to its output based on the fourth multibit control value, and;
a second AND gate comprising inputs coupled to the second signal input and an output of the fourth multiplexor.

13. The apparatus of claim 12 further comprising:
a charge pump circuit coupled to receive the output signals of the first and second AND gates and configured to charge or discharge a capacitor based on the output signals of the first and second AND gates;
wherein the capacitor is coupled to an input of the VCO circuit.

14. An apparatus comprising:
a circuit for generating a first pulse signal based on first and second input signals;
a first configurable delay circuit for adjusting the first pulse signal by delaying transmission of a leading edge of the first pulse signal by a time value that corresponds to first and second control values, and by delaying a trailing edge of the first pulse signal by a time value that corresponds to a third control value.

15. The apparatus of claim 14:
wherein the first configurable delay circuit comprises:
a first circuit input configured to receive the first pulse signal;
a plurality of first delay circuits, each of which is configured to delay signal transmission by a first delay time, wherein first delay circuits are coupled in series, wherein an input of one of the first delay circuits is coupled to the first circuit input;
a first switching device that is controlled by the first control value, wherein the first switching device comprises inputs coupled to respective outputs of the first delay circuits and the first circuit input, wherein the first switching device is configured to connect one of its inputs to its output based on the first control value;

a plurality of second delay circuits, each of which is configured to delay signal transmission by a second delay time, which is different than the first delay time, wherein the second delay circuits are coupled in series, wherein an input of one of the second delay circuits is coupled to an output of the first switching device;

a second switching device that is controlled by the second control value, wherein the second switching device comprises inputs coupled to respective outputs of the second delay circuits and the output of the first switching device, wherein the second switching device is configured to connect one of its inputs to its output based on the second control value;

a plurality of third delay circuits, each of which is configured to delay signal transmission by a third delay time, wherein the third circuits are coupled in series, wherein an input of one of the third delay circuits is coupled to the first circuit input;

a third switching device that is controlled by the third control value, wherein the third switching device comprises inputs coupled to respective outputs of the third delay circuits and the first circuit input, wherein the third switching device is configured to connect one of its inputs to its output based on the third control value a first AND gate coupled to the outputs of the second and third switching devices.

16. The apparatus of claim 15 further comprising:
a second configurable delay circuit for adjusting a second pulse signal;
wherein the second configurable delay circuit comprises:
a second circuit input configured to receive the second pulse signal;
a plurality of fourth delay circuits, each of which is configured to delay signal transmission by the first delay time, wherein the fourth delay circuits are coupled in series, wherein an input of one of the fourth delay circuits is coupled to the second circuit input;
a fourth switching device that is controlled by a fourth control value, wherein the fourth switching device comprises inputs coupled to respective outputs of the fourth delay circuits and the second circuit input, wherein the fourth switching device is configured to connect one of its inputs to its output based on the fourth control value;
a plurality of fifth delay circuits, each of which is configured to delay signal transmission by the second delay time, wherein fifth delay circuits are coupled in series, wherein an input of one of the fifth delay circuits is coupled to the output of the fourth switching device;
a fifth switching device that is controlled by a fifth control value, wherein the fifth switching device comprises inputs coupled to respective outputs of the fifth delay circuits and the output of the fourth switching device, wherein the fifth switching device is configured to connect one of its inputs to its output based on the fifth control value;
a plurality of sixth delay circuits, each of which is configured to delay signal transmission by the third delay time, wherein the sixth delay circuits are coupled in series, wherein an input of one of the sixth delay circuits is coupled to the second circuit input;
a sixth switching device that is controlled by a sixth control value, wherein the third switching device comprises inputs coupled to respective outputs of the third delay circuits and the first circuit input, wherein the third switching device is configured to connect one of its inputs to its output based on the sixth control value
a second AND gate coupled to the outputs of the fifth and sixth switching devices.

17. The apparatus of claim 16 wherein the second and third delay times are equal.

18. The apparatus of claim 17 further comprising:
a voltage-controlled oscillator (VCO) circuit;
a charge pump circuit coupled to receive output signals of the first and second AND gates and configured to charge or discharge a capacitor based on the output signals of the first and second AND gates;
wherein the capacitor is coupled to an input of the VCO circuit.

19. The apparatus of claim 14:
wherein the circuit is configured for generating a second pulse signal based on the first and second input signals;
a second configurable delay circuit for adjusting the second pulse signal by delaying transmission of a leading edge of the second pulse signal by a time value that corresponds to fourth and fifth control values, and by delaying a trailing edge of the second pulse signal by a time value that corresponds to a sixth control value.

20. The apparatus of claim 19 further comprising a voltage controlled oscillator (VCO) circuit that generates an output clock with a frequency that depends on the first and second pulse signals after they are adjusted by the first and second configurable delay circuits, respectively.

* * * * *